United States Patent
Balog et al.

(10) Patent No.: US 11,551,832 B2
(45) Date of Patent: Jan. 10, 2023

(54) SUPERCONDUCTOR WIRE BASED ON $MGB_2$ CORE WITH Al BASED SHEATH AND METHOD OF ITS PRODUCTION

(71) Applicants: USTAV MATERIALOV A MECHANIKY STROJOV SAV, Bratislava (SK);
ELEKTROTECHNICKY USTAV SAV, Bratislava (SK)

(72) Inventors: Martin Balog, Bratislava (SK); Peter Krizik, Bratislava (SK); Pavol Kovac, Borinka (SK); Imrich Husek, Bratislava (SK); Lubomir Kopera, Bratislava (SK); Alica Rosova, Bratislava (SK)

(73) Assignees: USTAV MATERIALOV A MECHANIKY STROJOV SAV, Bratislava (SK);
ELEKTROTECHNICKY USTAV SAV, Bratislava (SK)

( * ) Notice: Subject to any disclaimer, the term of this patent is extended or adjusted under 35 U.S.C. 154(b) by 485 days.

(21) Appl. No.: 16/613,471

(22) PCT Filed: May 19, 2018

(86) PCT No.: PCT/IB2018/053540
§ 371 (c)(1),
(2) Date: Nov. 14, 2019

(87) PCT Pub. No.: WO2018/211480
PCT Pub. Date: Nov. 22, 2018

(65) Prior Publication Data
US 2021/0090767 A1    Mar. 25, 2021

(30) Foreign Application Priority Data
May 19, 2017   (SK) .................. 50037-2017

(51) Int. Cl.
*H01B 12/06*   (2006.01)
*B22F 3/04*    (2006.01)
(Continued)

(52) U.S. Cl.
CPC .............. *H01B 12/06* (2013.01); *B22F 3/04* (2013.01); *B22F 7/04* (2013.01); *C22C 32/0036* (2013.01);
(Continued)

(58) Field of Classification Search
CPC ........ H01B 1/023; H01B 7/295; H01B 9/006; H01B 1/026; H01B 13/0036; H01B 3/08;
(Continued)

(56) References Cited

U.S. PATENT DOCUMENTS 3,297,415 A * 1/1967 Allen .................. C22C 32/0036
                                                    75/235
3,816,080 A * 6/1974 Bomford ............. C22C 32/0036
                                                    75/235
(Continued)

FOREIGN PATENT DOCUMENTS

JP    H05144626    6/1993
JP    2008083065   4/2008
(Continued)

OTHER PUBLICATIONS

A. Shcherbakov et al., "Development of MgB2 wires with an aluminum as a stabilizer"; 30th Annual Condensed Matter and materials Meeting Wagga Wagga Feb. 7-10, 2006.
(Continued)

*Primary Examiner* — Krystal Robinson
(74) *Attorney, Agent, or Firm* — Defillo & Associates, Inc; Evelyn A. Defillo

(57) ABSTRACT

The sheath (3) is a material, which includes an aluminium (Al) matrix, in which nanometric aluminium oxide particles
(Continued)

($Al_2O_3$) are homogenously dispersed, the content of $Al_2O_3$ is 0.25 to 5 vol. % and the balance is Al. It is preferred that $Al_2O_3$ originates from the surface layer present on Al powder used as feedstock material for consolidation. The superconductor based on magnesium diboride ($MgB_2$) core (1) is fabricated by powder-in-tube or internal magnesium diffusion to boron technology, while the tube is the Al+$Al_2O_3$ composite, which is a product of powder metallurgy. A loose Al powder is pressed by cold isostatic pressing, and then the powder billet is degassed at elevated temperature and under vacuum, and then is hot extruded into a tube. A thin diffusion barrier (2) tube filled up with a mixture of Mg and B powders or Mg wire surrounded with B powder is placed into the Al+$Al_2O_3$ composite tube under inert gas or vacuum. Such composite unit is cold worked into a thin wire and then annealed at 625-655° C. for 8-90 min, what results in a formation superconducting $MgB_2$ in a wire's core (1).

14 Claims, 11 Drawing Sheets

(51) Int. Cl.
| | |
|---|---|
| *B22F 7/04* | (2006.01) |
| *C22C 32/00* | (2006.01) |
| *H01B 1/02* | (2006.01) |
| *H01B 12/10* | (2006.01) |

(52) U.S. Cl.
CPC .............. *H01B 1/023* (2013.01); *H01B 12/10* (2013.01); *B22F 2301/052* (2013.01); *B22F 2302/05* (2013.01); *B22F 2302/253* (2013.01)

(58) Field of Classification Search
CPC .......... H01B 3/40; H01B 7/0225; H01B 3/10; H01B 3/302; H01B 7/16; H01B 7/28; H01B 1/04; H01B 1/125; H01B 13/004; H01B 13/24; H01B 3/002; H01B 3/307; H01B 9/008; H01B 12/06; H01B 12/10; H01B 13/0006; H01B 13/0016; H01B 13/0891; H01B 13/16; H01B 13/2613; H01B 17/305; H01B 17/32; H01B 3/082; H01B 3/105; H01B 3/44; H01B 3/441; H01B 3/46; H01B 5/002; H01B 7/0045; H01B 7/009; H01B 7/02; H01B 7/046; H01B 7/207; H01B 7/292; H01B 7/30; H01B 7/421; H01B 9/027; H01B 9/0611; C23C 16/45565; C23C 16/26; C23C 4/134; C23C 16/50; C23C 16/503; C23C 4/123; C23C 16/325; C23C 16/4581; C23C 16/4585; C23C 16/36; C23C 16/45525; C23C 16/4586; C23C 16/481; C23C 26/00; C23C 4/131; C23C 8/02; C23C 14/50; C23C 16/45523; C23C 16/46; C23C 16/5096; C23C 4/06; C23C 14/541; C23C 16/401; C23C 30/00; C23C 4/04; C23C 10/26; C23C 16/20; C23C 16/403; C23C 16/4405; C23C 16/458; C23C 16/4583; C23C 16/505; C23C 24/08; C23C 4/067; C23C 4/073; C23C 4/08; C23C 4/16; C23C 8/10; C23C 16/4411; C23C 16/455; C23C 16/511; C23C 16/515; C23C 16/517; C23C 18/1653; C23C 18/52; C23C 2/003; C23C 2/12; C23C 2/38; C23C 22/68; C23C 26/02; C23C 4/02; C23C 4/11; C23C 4/18; C23C 8/40; C23C 8/66; C23C 8/68; C23C 8/70; C23C 8/72
See application file for complete search history.

(56) References Cited

U.S. PATENT DOCUMENTS

| | | | | |
|---|---|---|---|---|
| 4,109,374 | A | * | 8/1978 | Whetstone .............. H01L 39/14 |
| | | | | 505/928 |
| 4,600,806 | A | * | 7/1986 | Beretta .................. H01B 7/295 |
| | | | | 174/120 SR |
| 5,089,455 | A | | 2/1992 | Ketcham |
| 5,968,671 | A | * | 10/1999 | Joseph .................... C22C 49/06 |
| | | | | 428/614 |
| 6,586,370 | B1 | * | 7/2003 | Holcomb ................ C23C 14/22 |
| | | | | 428/930 |
| 2002/0198111 | A1 | | 12/2002 | Tomsic |
| 2009/0017071 | A1 | | 1/2009 | Donovan |
| 2009/0156410 | A1 | | 6/2009 | Nakane et al. |

FOREIGN PATENT DOCUMENTS

| | | |
|---|---|---|
| WO | WO2008063708 | 5/2008 |
| WO | WO2014109803 | 4/2014 |

OTHER PUBLICATIONS

Kovacc P et la., "Selected properties of GlidCopÂ® Â sheathed MgB2 wires;Selected properties of GlidCoptextregistered sheathed MgB2 wires"; Superconductor Science and Technology, IOP Publishing, Techno House, Bristol, GB, vol. 25, No. 9, Jul. 2, 2012.

Kario et al., "Ex situ MgB2 barrier behavior of monofilament in situ MgB2 wires with Glidcopreg sheath material"; Superconductor Science and Technology, IOP Publishing, Techno House, Bristol, GB, vol. 23, No. 11, Oct. 5, 2010.

Kovac P Et al, "Lightweight Al-stabilized MgBconductor made by the IMD process"; Superconductor Science and Technology, IOP Publishing, Techno House, Bristol, GB, vol. 30, No. 11, Sep. 19, 2017.

* cited by examiner

SUPERCONDUCTOR WIRE BASED ON MGB₂ CORE WITH Al BASED SHEATH AND METHOD OF ITS PRODUCTION

CROSS REFERENCE TO RELATED APPLICATION

This application is a national stage entry of PCT/IB2018/053540 filed May 19, 2018, under the International Convention and claiming priority over Slovakia Patent Application No. PP 50037-2017 filed May 19, 2017.

FIELD OF THE INVENTION

The invention relates to a lightweight superconductive wire based on magnesium diboride ($MgB_2$) core stabilized with a sheath from aluminium (Al) matrix composite of a low density. Al composite sheath meets the demanding and contradictory requirements as it technologically allows the fabrication of ultralight thin superconducting wires based on $MgB_2$ core, while it provides the appropriate mechanical and electrical properties required for superconductor operation. The invention describes a process by which the superconductor with Al composite sheath is fabricated at low production costs.

BACKGROUND OF THE INVENTION

The superconducting effect can be utilized in many applications such as in the space program, aerospace area and energy industry, where for a number of reasons the low rotational and total weight of devices which includes superconductive wire is needed. The low weight of the superconductor in such applications assures higher efficiency, lower power consumption, higher speeds and acceleration of moving devices.

Nowadays, superconductor designs, for example based on NbTi and $Nb_3Sn$, use a copper (Cu) sheath that has suitable electrical and mechanical properties. However, Cu sheath, which forms a significant volume portion of the superconducting wire, contributes to the already high weight of NbTi and $Nb_3Sn$ superconducting core. The use of other metals and alloys as the sheath material, such as niobium (Nb) or steel, also leads to the high weight of superconducting wires. Of all known superconducting materials, $MgB_2$ is the lightest superconducting material of approximately three times lower density compared to e.g., $Nb_3Sn$. Thus, lightweight superconducting wires are naturally designed based on the $MgB_2$ superconducting core. However, also in the case of $MgB_2$ based superconductors, technical solutions which utilize Cu sheath are known. It is natural that Al with more than three times lower density appears to be the desired alternative to Cu substitution. However, only general descriptions of the use of Al in the shell of superconductors are known.

The technical solutions according to US 20020198111A1 and WO 2014109803A2 describe a process for the continuous production of superconducting wire (tubes) containing superconducting material, in particular $MgB_2$. A metal strip enters the shaping and filling device, it is first formed into a U-shaped profile, then it is filled with $MgB_2$ powder and then passes through the forming tools in which it is shaped into a closed O-shaped tube, which is heat treated afterwards. The metal strip material of this disclosure may be a metal including Al.

Open specification U.S. Pat. No. 5,089,455A discloses the production of flexible, inorganic sintered structures of various materials, including alumina ($Al_2O_3$) for various applications, for example superconductors.

Disclosed in the exemplary embodiment according to JP 2008083065A, the $MgB_2$ based superconductor having an insulating layer of silicon dioxide or $Al_2O_3$ on its surface is described. JPH 05144626A discloses the manufacture of an insulating material for a superconducting wire, one component of which is $Al_2O_3$.

US 2009156410A1 discloses the production of $MgB_2$ tape or wire by introducing $MgB_2$ powder into the pipe, wherein the material of the tube may also be Al. Similarly, US 2009170710A1 describes $MgB_2$ superconducting wire in the sheath, and its material may also be Al.

The main motivation for the use of Al as a superconducting material based on light $MgB_2$ superconducting material is a significant multiple reduction in the weight of the superconductor. However, the practical use of Al in $MgB_2$ superconductors leads to fundamental technological problems and constraints. This is due, in particular to two reasons, namely that the melting point of the pure Al is relatively low (approximately 655-660° C.) and the mechanical strength of the pure Al is insufficient for the production and operation of the $MgB_2$ superconductor. No specific embodiments are known in which Al, Al alloy or Al based composite would be used as a sheath material covering the superconducting $MgB_2$ core with an optional barrier layer and, at the same time, the superconducting wire would achieve the required mechanical, electrical and thermal properties necessary for its operation.

From the various technological approaches for the preparation of superconducting $MgB_2$ wires, so-called in-situ "powder-in-tube" (PIT) technology is preferred, due to its relative simplicity and low synthesis temperatures, higher critical current densities in small magnetic fields compared to wires fabricated by ex-situ PIT. During production of the wire by in-situ PIT, magnesium (Mg) and boron (B) components are deformed in the form of a mixture of elemental powders within the sheath tube alternatively with or without diffusion barrier layer used (typically tantalum (Ta), Nb, titanium (Ti), iron (Fe)). Preferably, a slightly modified process, so-called internal Mg diffusion (IMD) into B", in which Mg wire instead of Mg powder is used to produce $MgB_2$ core with significantly increased density and critical current density. The sheath material must have sufficient mechanical strength and formability to provide the desired uniform and intense deformation and compaction of the Mg and B component in the core of the thin wire along its entire length during its manufacturing by a typically implemented combination of deformation techniques, such as extrusion, rotatory swaging, groove rolling, drawing, etc. Subsequently, $MgB_2$ is formed in the core of a deformed wire by reaction between the Mg and B component during annealing at temperatures close to the melting of Mg (i.e., approximately 650° C.). If an intensively mechanically milled mixture of the Mg and B powders is used, the reaction synthesis temperature can be reduced to 600-625° C., but this approach does not yield attractive properties of the $MgB_2$ superconducting core prepared by IMD. Pure wrought Al has insufficient mechanical strength and therefore it is not possible to distribute sufficient plastic deformation towards the Mg and B component in the core during processing. Plastic straining during intensive working operations dominantly takes place within the Al sheath, the Mg+B core remains insufficiently densified and deformed, eventually. This strictly restricts the working process and complicates the stabilization of the core of the wire during its manufacture. In addition, the low mechanical strength of pure wrought Al is not sufficient to mechanically stabilize the superconducting $MgB_2$ core when operating under cryogenic conditions in some applications where there is an intense mechanical tension of the superconductor. For example, these are the applications in high-field superconducting magnets where large electromagnetic forces act on individual threads in a coil and for the transfer of very large currents. Moreover, high strength and ductility are necessary during mechanical manipulation with annealed superconductors e.g., during winding superconductor wires into smaller diameter coils, so as to guarantee the integrity of the brittle $MgB_2$ core to avoid cracking in the core and at the core-sheath (barrier) interface, which would lead to an apparent reduction of transport current. At the same time, due to the low melting point of the pure Al a melting of Al may take place during formation of the $MgB_2$ core and a resulting loss of wires integrity. This problem can be solved only partially but not adequately by reducing the reaction temperature between Mg and B as close as possible to the melting point Mg. This approach, however, is complicated by the fact that the Mg+B reaction is exothermic and the reaction heat increases the local temperature during the $MgB_2$ synthesis.

The use of Al alloys with a higher strength than the one of a pure wrought Al for the sheath is also not likely. This is because the standard Al alloys suitable for working have an even lower melting point or a temperature onset of melting of local eutectics than pure Al i.e., <655-660° C. This would result in in (local) melting and a loss of the dimensional integrity of the superconductor during $MgB_2$ synthesis even at lower temperatures. In addition, standard wrought Al alloys are structurally unstable at temperatures above about 550° C. i.e., far below the temperature of $MgB_2$ core synthesis, resulting in undesirable microstructural changes such as grain growth, segregation of alloying elements, coarsening of present phases, and consequently a loss of their good mechanical properties. Last but not least, Al alloys have a significantly increased electrical and thermal resistance which leads to an undesired increase in the resistances of the superconductor wire.

A new embodiment of a superconductor sheath from a lightweight material with a density significantly lower than the density of Cu, ideally at the density level of pure Al i.e., approximately of 2.7 $g \cdot cm^{-3}$, is desired and is not known, which also provides advantageous mechanical, electrical and thermal properties, and will be technologically feasible for a large-scale production of $MgB_2$ based core superconductive wires.

SUMMARY OF THE INVENTION

The above-mentioned drawbacks are largely eliminated by the superconductor with the $MgB_2$ core and the sheath from Al-based composite, wherein the sheath covers at least one $MgB_2$ core, the sheath and the core is or is not separated by a thin diffusion barrier layer, which may be of various materials (e.g., Ti, Ta, Nb, Fe), according to the invention, whose principal idea lies in the fact that the superconductor sheath is made by forming Al composite material in the form of a tube, the composite tube is being the product of powder metallurgy (PM), wherein the microstructure of the worked Al composite material of the sheath consists of near- or sub-micrometre Al grains and is stabilized by a small amount of homogeneously dispersed nanometric $Al_2O_3$ particles, which are formed in situ in Al matrix.

The essential feature of the invention is the production of Al composite material by PM, which, in addition to the advantages of the technology used, brings a number of other synergistic advantages during deformation of the composite and $MgB_2$ synthesis.

Al composite tube is made of a material prepared by compacting fine atomized Al powder by PM processes such as direct and indirect extrusion, rolling, cold and hot isostatic pressing, forging, uniaxial pressing, vacuum hot pressing, sintering, etc. The particle surface of the fine as-atomised Al powder is fully covered with a thin passivating layer of native $Al_2O_3$. The natural thickness of the $Al_2O_3$ layer on the surface of a pure Al particle having a mean particle size ($d_{50}$) of 0.5 to 20 pm after atomization is about 2.5 nm, not exceeding the critical limit of the natural formation of the $Al_2O_3$ layer that is approximately 4 nm. The metallic core of Al powder i.e., the volume of powder underneath the $Al_2O_3$ layer, is pure Al, which can be ultra-pure, technically pure, commercially pure, with a purity of 99.9999 to 98 wt. %. Upon consolidation the Al powder densifies and consolidates into a compact body with a low residual porosity, which may be less than 5 vol. %, preferably less than 1 vol. %, and dispersion of the $Al_2O_3$ component into Al matrix takes place. This ensures a uniform distribution of the $Al_2O_3$ component in the Al matrix, which would be difficult and ineffective to achieve by consolidation of Al and nanometric $Al_2O_3$ powder blends. Al matrix of the composites is characterized by fine Al grains with a typical size of 0.5 to 10 pm, the value of which is determine in particular by the $d_{50}$ value of the Al powder used. Depending on the consolidation technology used, there may also be a reduction in the Al grain size well below the $d_{50}$ value of the used Al powder, especially during the consolidation realized by shear plastic deformation e.g., extrusion, rolling, etc.

The volume fraction of the $Al_2O_3$ component is given by the thickness of the $Al_2O_3$ layer on the Al powders and the specific surface area of the Al powders, and can thus be varied and controlled using Al powders with a different $d_{50}$ and surface morphology, and the thickness of the $Al_2O_3$ layer. Depending on the consolidation technology used, the $Al_2O_3$ component dispersed in the Al matrix has a different shape and crystalline state, namely:
i) an amorphous (am)-$Al_2O_3$ network with a wall thickness of approximately 5 nm;
ii) am-$Al_2O_3$ platelets with a thickness of about 2.5-5 nm;
iii) crystalline $\gamma/\delta$-$Al_2O_3$ particles with a diameter of approximately 25-28 nm.

In all cases, the $Al_2O_3$ component has a very good metallurgical bond to the Al matrix as it is formed in situ.

The volume fraction of $Al_2O_3$ in the Al matrix of the composite tube shall be as low as possible so as not to later degrade the electrical and thermal conductivity of the superconductor, and thus it forms only 0.25 vol. % to 5 vol. % and the balance is formed namely by Al and any technological impurities or impurities. Preferably, the portion of $Al_2O_3$ in the composite tube is 0.5 vol. % to 3 vol. %. The portion of potential impurities shall not exceed 1 vol. %, preferably not more than 0.3 vol. %. In order to achieve the required portion of the $Al_2O_3$ component in the Al matrix and the required micrometric to submicrometric Al grain size in the sheath of superconductor it ought to be used a gas or water-atomized Al powder with $d_{50}$ in the range of 0.5 to 20 pm. The Al composite tube can be directly net-shape manufactured by PM processes e.g., tube extrusion, or is fabricated by post machining of Al composite product produced by PM processes e.g., forging. A representative approach of composite tube manufacturing is for example as follows:
i) cold isostatic pressing of feedstock loose Al powder;

ii) degassing of the cold-pressed powder billet at elevated temperature and under vacuum in order to removed physically and chemically adsorbed moisture from the surface of the Al powder;

iii) hot extrusion of the degassed powder billet composite to a tube, or eventually a hole is drilled to an extruded rod.

Alternatively, to the compacting of fine Al powder, the composite tube can be prepared from an Al+Al$_2$O$_3$ powder mix prepared by ball milling of Al atomized powder, or a mixture of Al powder and nanometric Al$_2$O$_3$ powder. During the milling complex processes take place e.g., Al grain refinement, homogenization and dispersion of the nanometric Al$_2$O$_3$ powder in the Al matrix, and an increase in the Al$_2$O$_3$ content by intentional oxidation of the newly formed Al surfaces. However, this approach is less economical, reproducible and easily controllable compared to the above-described approach of compacting pure fine Al powder.

In a view of achieving high productivity, it is preferred that the superconductor according to the invention is produced by in-situ PIT or even more preferably by IMD. The composite Al+Al$_2$O$_3$ tube is used in this case as the input material for subsequent superconductor production. If a diffusion barrier layer is used in the superconductor wire a barrier tube is placed into the Al+Al$_2$O$_3$ tube and subsequently filled with a mixture of Mg and B powders or centred Mg wire surrounded with B powder under an inert gas atmosphere or in a vacuum. If the barrier layer is not used in the superconductor a mixture of Mg and B powders or centred Mg wire surrounded with B powder are filled directly into the Al+Al$_2$O$_3$ tube under an inert gas atmosphere or in a vacuum. Such assembly unit is cold-worked into a wire (e.g., by hydro extrusion, rotary swaging, groove rolling or drawing) and once the final cross-sectional dimension of the wire is reached (e.g., approx. 1 mm) it is subjected to a heat treatment to form a superconducting MgB$_2$ core by the reaction synthesis between Mg and B components.

The single core Mg+B composite may be combined into a multifilament superconductive wire by inserting the number elements (7-61) into a larger diameter Al+Al$_2$O$_3$ composite tube and processed into a wire similarly as in a case of a single-core wire. Owing to fine-grained structure of the Al+Al$_2$O$_3$ composite shows very good mechanical properties, namely it has the high strengths and sufficient ductility necessary for wire fabrication. For example, the yield tensile strength of as-formed Al+Al$_2$O$_3$ composite can be up to about 250 MPa, which is almost one order more than pure wrought Al. This ensures the desired transfer of load from the sheath towards the core, homogeneous and intense plastic deformation, and compaction of the Mg and B components in the core of the thin wire along its entire length during its production by cold-working operations typically realized by groove rolling. In addition, the Al grain structure is stabilized by the stabile nanometric Al$_2$O$_3$ dispersoids throughout the hot- and cold-working processes, thus ensuring the stability of a grain structure of the Al matrix over a wide range of production temperatures ranging from a room temperature to temperatures close to the melting point Al. There are no distinct degrading microstructural changes, which would take place upon the hot and/or cold-working processes i.e., there is no major softening, dynamic and static recrystallization, and Al grain growth. Thus, unlike a pure wrought Al, the undesired situation is avoided when the Al sheath is deformed preferably and the Mg+B core remains insufficiently densified or compacted. During wire forming, when intensive shear plastic deformation is induced into the wire, Al grain structure stabilized by the Al$_2$O$_3$ component is gradually refined and recrystallization and grain growth are avoided. Moreover, dispersion of the Al$_2$O$_3$ dispersoids in the Al matrix improves further throughout the working of the wire.

Unique stabilizing effect by the Al$_2$O$_3$ component is taken advantage of also in a later technological step during the formation of the superconducting MgB$_2$ core at a relatively high reaction temperature between the Mg and B components in the core of the formed wire at >625° C. or >635° C., in addition to local overheating of the wire, which occurs due to the exothermic reaction between B and Mg. The composite sheath material is short-term (for a minimum of 30 minutes) resistant to temperatures close to the melting point of technically pure Al (about 650° C. to 655° C.), thereby ensuring microstructural stability, thereby preserving the mechanical properties and surface integrity of the sheath and the entire superconductor (FIGS. 17 and 18). Even during very short exposures (in order of min.) at temperatures above 650° C., the Al$_2$O$_3$ component still well stabilizes the sheath Al material and there is no significant loss of surface integrity, but Al grains already coarsens. If the Al$_2$O$_3$ component or part of it is prior to the reaction annealing i.e., prior to the formation of the superconducting MgB$_2$ core in amorphous state, it defitrificates, crystallizes to γ-Al$_2$O$_3$ or δ-Al$_2$O$_3$ and changes morphology from plate-like particles to equiaxed particles during annealing. The result is a composite structure of a severely deformed fine-grained Al matrix, in which the nanometric γ/δ-Al$_2$O$_3$ particles are dispersed homogeneously, while they reside at the Al grain boundaries as well as within Al grains interiors (FIGS. 4 and 5). The average transversal Al grain size is preferably in the range of 400-900 nm or up to 800 nm, depending on the d$_{50}$ of used Al powder, the amount of shear deformation induced during the powder compaction and the superconducting wire forming, and the temperature and reaction time of the annealing. In most applications, Al grains in the resulting Al+Al$_2$O$_3$ composite have a transversal grain size of less than 10 μm, preferably less than 1 μm. The transversal Al grain size have a dominant influence on the tensile strength of the Al+Al$_2$O$_3$ composite, which is significantly controlled by empirical so-called Hall-fetch relationship. The Al$_2$O$_3$ component and its content up to 5 vol. % has no direct impact on mechanical strength at room temperature and cryogenic temperatures. Depending on the size of the Al powder and its purity, induced plastic deformation, and the temperature and time of the reaction annealing, the strength of the Al+Al$_2$O$_3$ composite up to about 290 MPa can be reached.

Exceptional structural stability ensures that the Al composite sheath material retains the required mechanical properties i.e., high strength together with sufficient ductility, even after MgB$_2$ formation i.e., when operating a superconductor. This is advantageously utilized in some applications, where there is intense mechanical tensile loading of the superconductor under cryogenic conditions e.g., in high-field superconducting magnets or the cables for the transfer of very large currents). High strength is also required where mechanical manipulation occurs with an annealed superconductor e.g., during winding superconductor wires into smaller diameter coils.

The composite Al+Al$_2$O$_3$ material has a low density of about 2.71 g·cm$^{-3}$, the MgB$_2$ core having a density of about 2.55 g·cm$^{-3}$, while the shell typically represents 60 to 75 vol. % of the entire volume of the superconductor. Thus, the resulting superconductor according to the invention has a significantly lower mass (at least 2.5-3 times less) than the standard NbTi, Nb$_3$Sn, and MgB$_2$ based superconductors with an outer Cu sheath. The low weight of the superconductor with density <2.9 g·cm$^{-3}$ (using a relatively heavy Ta barrier layer) can be preferably used for technical solutions with moving and rotating parts, for example in transport and power applications, superconducting wind generators, in aerospace, train engines, in superconducting levitation drives, in space program as active shielding of human crew from cosmic radiation and generally in technical solutions with moving, rotating parts.

The sheath based on Al allows protection of surface by anodic oxidation (i.e., anodizing) and thus allows to form a very thin insulating Al$_2$O$_3$ layer on the surface of the sheath, with a thickness of several pm, that is stabile during the annealing and MgB$_2$ core formation, thus making it cheap and efficient insulation of superconducting winding. Such thin, thermally conductive, stabile and sufficiently electrically insulating layers cannot be prepared on surfaces of Cu sheathed superconducting wires. The use of Al+Al$_2$O$_3$ composite on the superconductive sheath according to the invention thus brings another consequential advantage in the form of a thin yet reliable electrical insulation, which again contributes to the overall low weight of the resulting superconductor.

In addition to good mechanical properties, Al composite with a relatively low Al$_2$O$_3$ content also ensures that the superconductor also has a relatively high electrical and thermal conductivity. The electrical conductivity decreases with decreasing grain size of Al, with an increasing content of Al$_2$O$_3$ component and a lower purity of the metal core Al of powder, and thus can be controlled by varying the size and surface area of the incoming Al powder correctly. The Al+Al$_2$O$_3$ composite has a lower absolute value of electrical conductivity than OHC Cu coating but still sufficient to be used for the superconductive sheath, for example, Al composite with 1.9 vol. % of Al$_2$O$_3$ fabricated using Al 99.995 wt. % powder has an electrical resistance, depending on the annealing temperature of 9.8-7.5·10$^{-10}$Ω at 27 K (FIG. 19). Alcomposite with 1.4 vol. % γ-Al$_2$O$_3$ fabricated using Al 99.8 wt. % powder has a 9.5·10$^{-8}$Ω electrical resistance at 25 K. The combination of a lightweight superconductor of higher strength and a relatively low electrical conductivity can even be advantageously utilized in electric motors or generators, where the magnetic field surrounding the superconductor changes, and eddy currents are induced into the over-conductive sheath, what results in increase of temperature. Increased resistance of the outer sheath reduces the eddy currents and hence the undesired overheating of the superconductor at alternating current applications.

With respect to microstructure with fine Al grains decorated with Al$_2$O$_3$ nanoparticles, the diffusion processes in the Al composite are suppressed. The composite Al+Al$_2$O$_3$ has a reduced diffusivity of elements such as Ti, Ta, Nb, V, Mg in its structure. This means that the reaction between the barrier material and the composite Al sheath, which may result in the formation of an undesirable interfacial interface, is suppressed to a large extent and that the barrier material can be selected from a wide range of materials (FIG. 10). However, in order to maintain the light concept of the superconductor as a whole, the barrier of a lightweight material such as Ti with a density of 4.5 g·cm$^{-3}$ (FIG. 20) or V with a density of 6.0 g·cm$^{-3}$ is preferred. In the preferred arrangement of the Al+Al$_2$O$_3$ composite structure, it may even be possible to completely omit the diffusion barrier to further reduce the weight of the superconductor. This, for example, in the case of obviation of the Ta barrier, represents about 8% further reduction of weight. Thus, the invention provides an arrangement wherein the MgB$_2$ and Al+Al$_2$O$_3$ core composite sheath are or are not separated by a barrier layer which may be of different materials e.g., Ti, Ta, Nb, Fe.

Utilization of the am-Al$_2$O$_3$ layer on the surface of the input Al particles thus yields a number of synergistic advantages, in particular, as follows. The present solution allows a relatively simple fabrication of the composite, wherein the Al powder is also an Al$_2$O$_3$ component carrier. This results in a uniform distribution of the Al$_2$O$_3$ component throughout the volume of the composite sheath, as well as the uniform size of the crystalline Al$_2$O$_3$ particles in the entire volume of the composite shell. Due to their in-situ character, the evenly dispersed nanometric γ/δ-Al$_2$O$_3$ particles effectively stabilize the Al matrix structure and thus indirectly provide excellent mechanical properties of the Al+Al$_2$O$_3$ composite sheath during the production of the superconducting wire and subsequently during its operation. The relatively low content of nanometric Al$_2$O$_3$ particles evenly dispersed in the Al matrix does not lead to a drastic reduction in electrical and thermal resistance, and the superconductor retains sufficient superconducting electrical properties and thermal conductivity. The electrical conductivity of the superconductor sheath can be easily modified by the correct choice of the feedstock Al powder.

The invention describes a specific technical solution for the production of a real ultra-light superconductor, which is economically meaningful and feasible at a large-scale. This is in contrast to the state of the art, which only describes the general possibility of using Al without a specific technical solution as one of several possible sheath materials by which the core of the MgB$_2$ superconductor is enclosed.

The MgB$_2$ superconductor sheath is made of ultra- or fine-grained Al composite material with a low Al$_2$O$_3$ content component that meets demanding and contradictory requirements. The ultra-lightweight superconductor has an extremely low density <2.9 g·cm$^{-3}$ even when using a relatively heavy Ta barrier layer. The superconductor can be designed without the use of a barrier layer, resulting in an additional reduction in its density <2.7 g·cm$^{-3}$. The superconductor has excellent mechanical and good electrical properties.

Changing the annealing temperature and time in the MgB$_2$ core synthesis can alter the microstructure of the Al composite material sheath, thereby altering the combination of the mechanical and electrical properties of the superconductor.

The sheath from Al+Al$_2$O$_3$ composite material provides a simple protection of its surface by anodic oxidation, which produces a thin insulating Al$_2$O$_3$ layer on the surface of the shell, resulting in a reduction of AC losses in the superconductor.

The Al+Al$_2$O$_3$ composite material is prepared by PM methods.

DESCRIPTION OF DRAWINGS

The invention is further described in more detail with the aid of FIGS. 1 to 22. The cross-sections of the superconductor wires are shown schematically, the core/the cores size and the sheath ratio are being illustrative only. Particularly shown structures of Al particles and Al$_2$O$_3$ are not to be interpreted as a narrowing range of protection.

THE EXEMPLARY EMBODIMENT

Example 1

In this example, according to FIGS. 1, 3 to 11, 13 and 16, the single-core superconductor is fabricated from the Mg 99.99 wt. % wire with the diameter of 3 mm, which is surrounded by the B 99.8 wt. % powder in the Ta 99.9 wt. % tube with an inner diameter of 5.5 mm and an outside diameter of 7.1 mm. The Mg+B/Ta semi-product is rotary swaged to the tube with the diameter of 6 mm and then inserted into the Al+Al$_2$O$_3$ composite tube. The Al+Al$_2$O$_3$ composite is manufactured using the nitrogen atomized Al 99.8 wt. % powder with d$_{50}$=3 μm. The atomized powder is cold isostatically pressed into a green billet, which is subsequently degassed at 420° C. for 12 h under vacuum. The degassed powder billet is extruded at 420° C. using a reduction ratio of 8:1 into a rod with the diameter of 10 mm, from which a tube with an internal diameter of 6.3 mm and an outside diameter of 9.1 mm is machined. Such an assembly unit of Al+Al$_2$O$_3$/Ta/Mg+B is then cold rotary swaged to a diameter of 7.5 mm and cold groove rolled to a wire with approximate cross-section of 1×1 mm$^2$.

Figure 3:
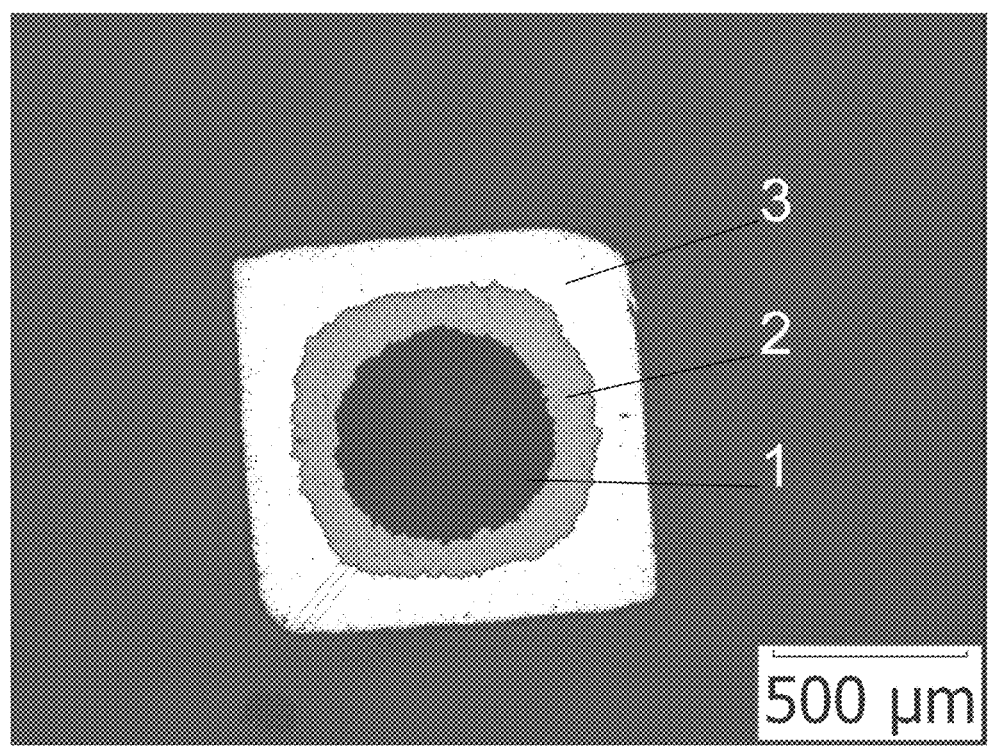
FIG. 3 is a cross-sectional image of an Al+Al$_2$O$_3$ superconductor with a composite sheath, Ta barrier and MgB$_2$ core.
Figure 4:
FIG. 4 is a longitudinal cross-sectional image.
Figure 5:
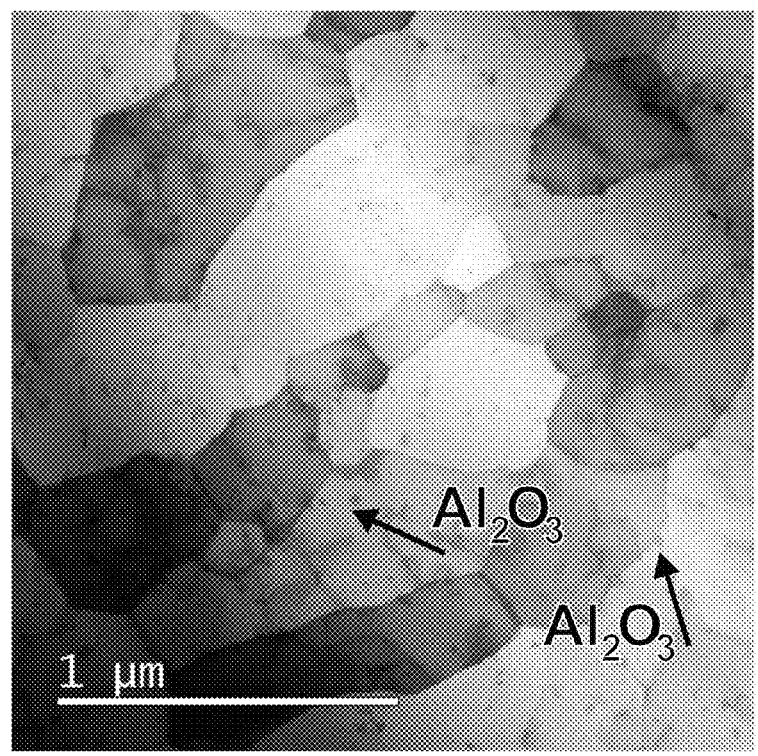
FIG. 5 a transversal microstructure of the Al+Al$_2$O$_3$ sheath composite with deformed Al grains directed to the deformation direction after cold working are shown. Images are obtained in a transmission electron microscope. The white arrow in the microstructure of FIG. 4 represents the direction of the deformation axis. The red arrows in the microstructure show crystalline Al$_2$O$_3$ nanoparticles within the Al grains interiors as well as the Al grain boundaries.
Figure 6:
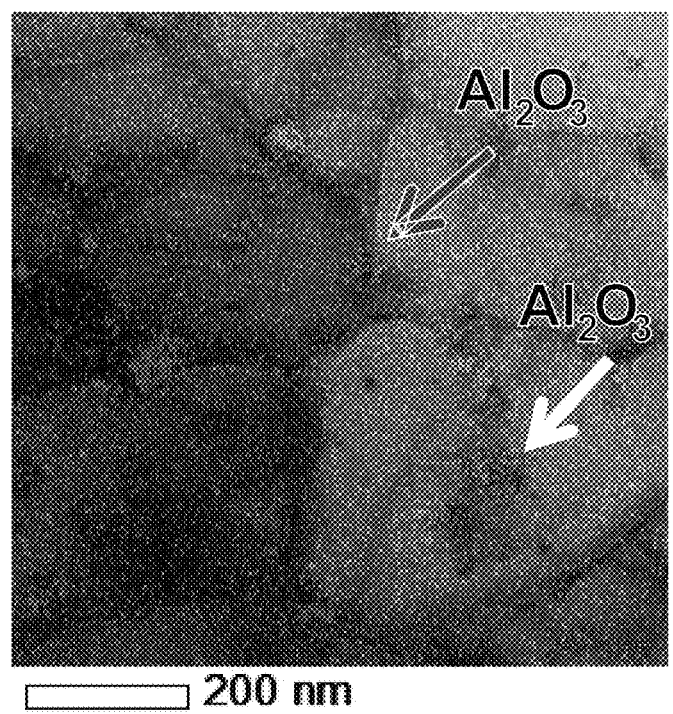
FIG. 6 shows a combined elemental map demonstrating the presence of Al$_2$O$_3$ particles in the cross-sectional structure of the composite Al after cold working. The dark contrast areas (in the original format shown in red) indicate the presence of oxygen (O), a light contrast areas (in the original format shown in green) of the presence of Al. The white arrow shows the Al$_2$O$_3$ particles present within the Al grains interiors, dark (in the original format shown as red) arrow shows the Al$_2$O$_3$ particles present at the Al grain boundaries. Images are obtained in transmission electron microscope using EDS analysis.
Figure 7:
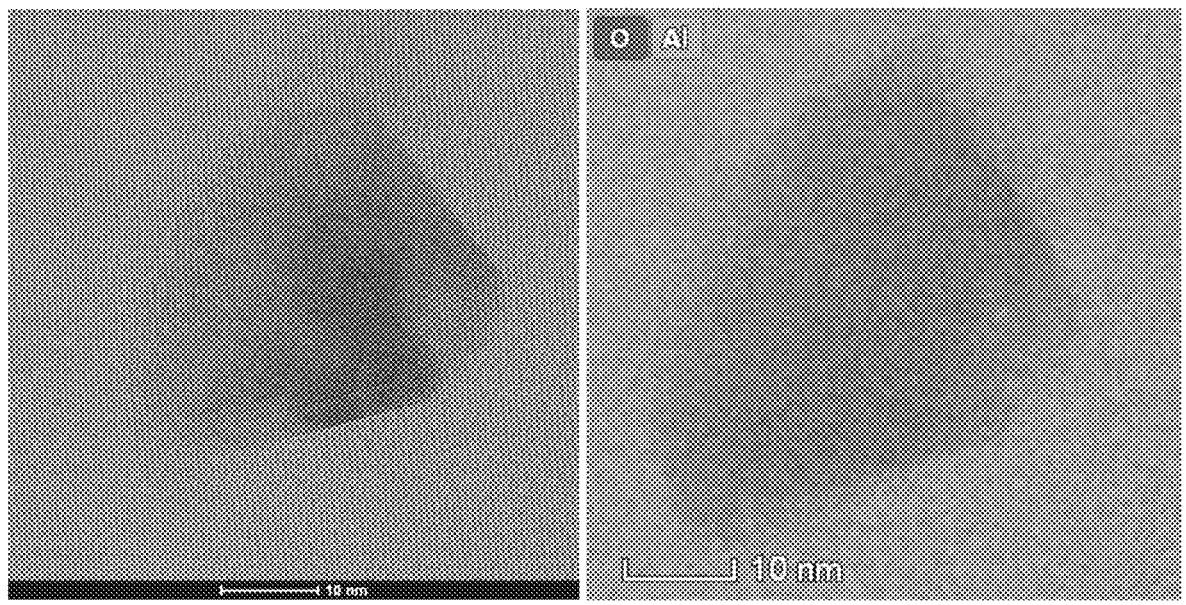
FIG. 7 shows the high resolution γ-Al$_2$O$_3$ particle (left) and EDS elemental analysis (right)
Figure 8:
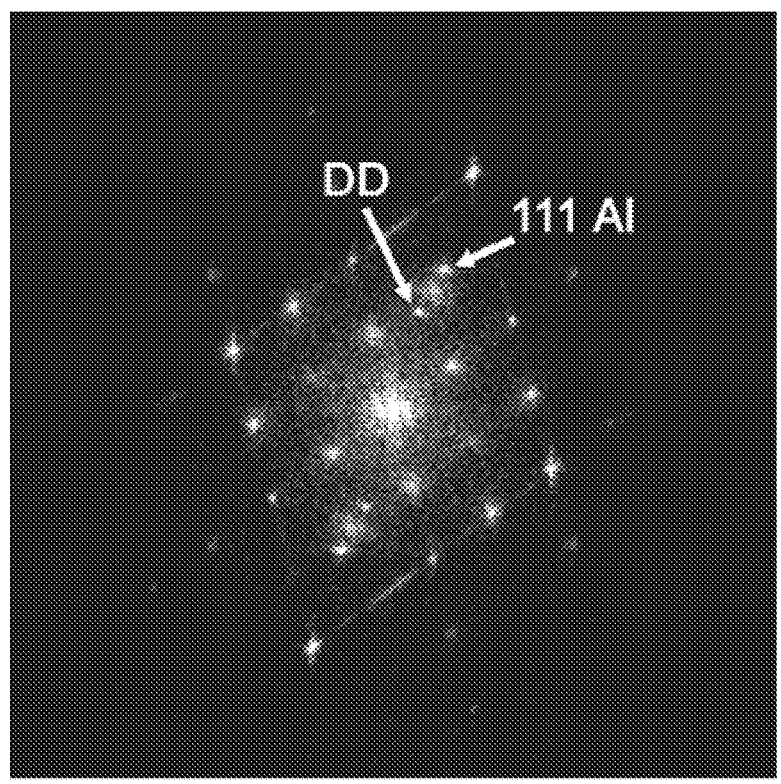
FIG. 8 shows a corresponding FTT pattern confirming the presence of γ-Al$_2$O$_3$ obtained in transmission electron microscope.
Figure 11:
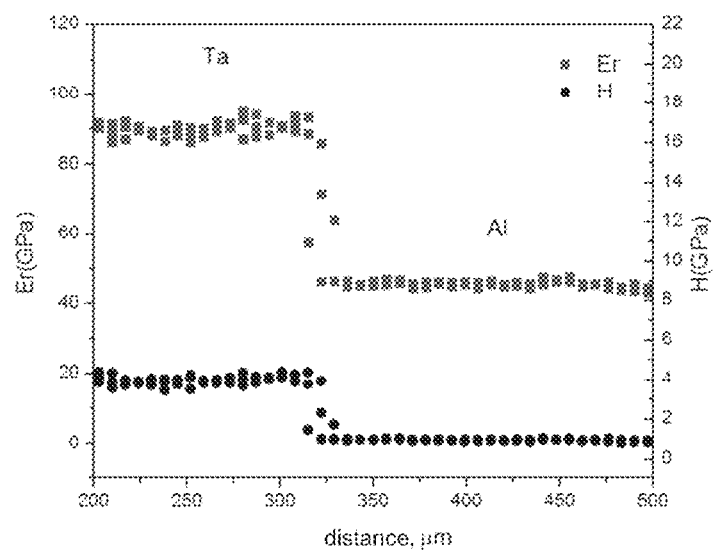
FIG. 11 shows the hardness (H) and reduced Young's modulus (Er) along the composite sheath, the interface and the Ta barrier (the hardness indents are shown in the microstructure of FIG. 10).
Figure 15:
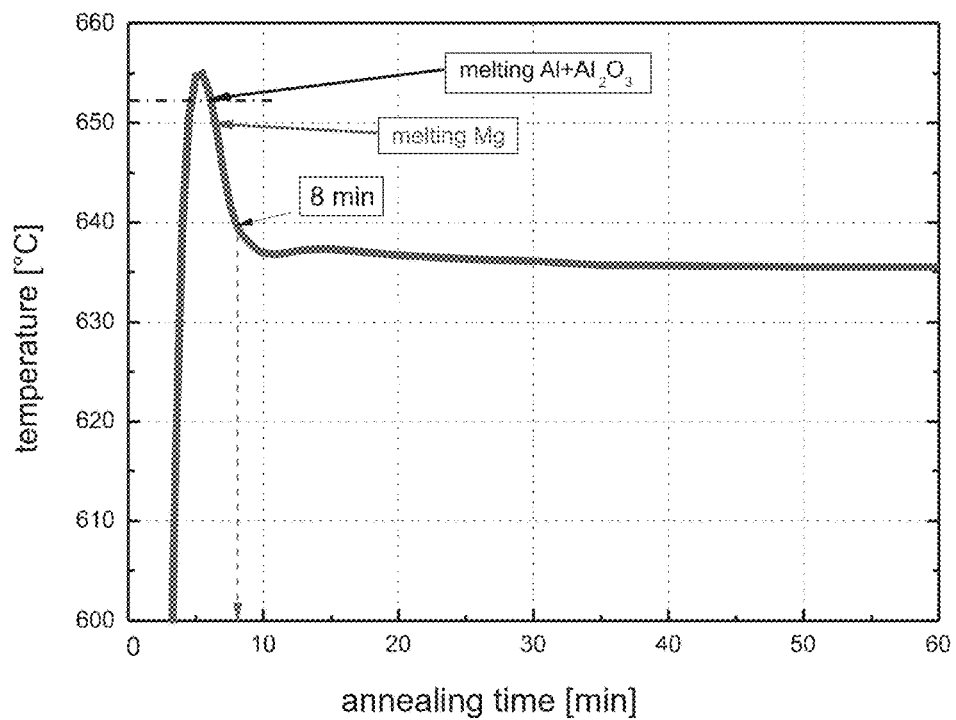
FIG. 15 is a graph showing the temperature evolution over time during the annealing of the Al+Al$_2$O$_3$/Ta/Mg+B wire prepared from Al of 99.8 wt. % powder of d$_{50}$=3 μm.

The Al+Al$_2$O$_3$ composite sheath mechanically stabilizes the Mg+B/Ta core 1 during intense plastic deformation, ensures homogeneous deformation along the cross-section and length, compaction of Mg+B components in the core, and assures the integrity of Al+Al$_2$O$_3$/Ta/Mg+B assembly unit without the formation of undesirable cracks other flows. The intensively deformed Al+Al$_2$O$_3$/Ta/Mg+B wire is subsequently subjected to annealing at 635° C. (FIG. 15) for a total time of 60 min and the heating rate of 25° C.·min$^{-1}$ under a protective atmosphere of argon (Ar), during which reaction between Mg wire and B powder takes place, followed by formation of the MgB$_2$ superconducting core 1 (as shown in FIG. 3). Due to the exothermic reaction between Mg and B, overheating occurs and the temperature increases shortly (up to about 8 min) up to about 655° C. (FIG. 11). In the resulting superconductor, MgB$_2$ core 1 forms approximately 36 vol. %, Ta barrier 2 approximately 5 vol. %, and Al composite sheath 3 approximately 59 vol. %.

Figure 10:
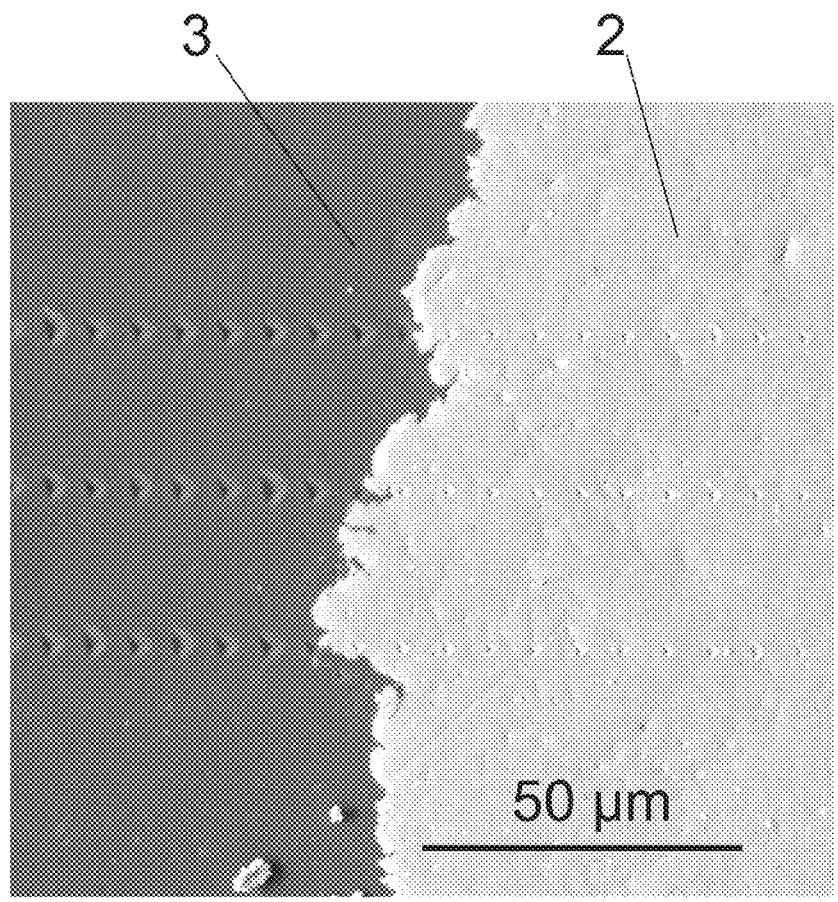
FIG. 10 shows the interface between the Al+Al$_2$O$_3$ sheath and the diffusion Ta barrier in the annealed superconductor with MgB$_2$ core in the transversal direction obtained in the scanning electron microscope.
Figure 12:
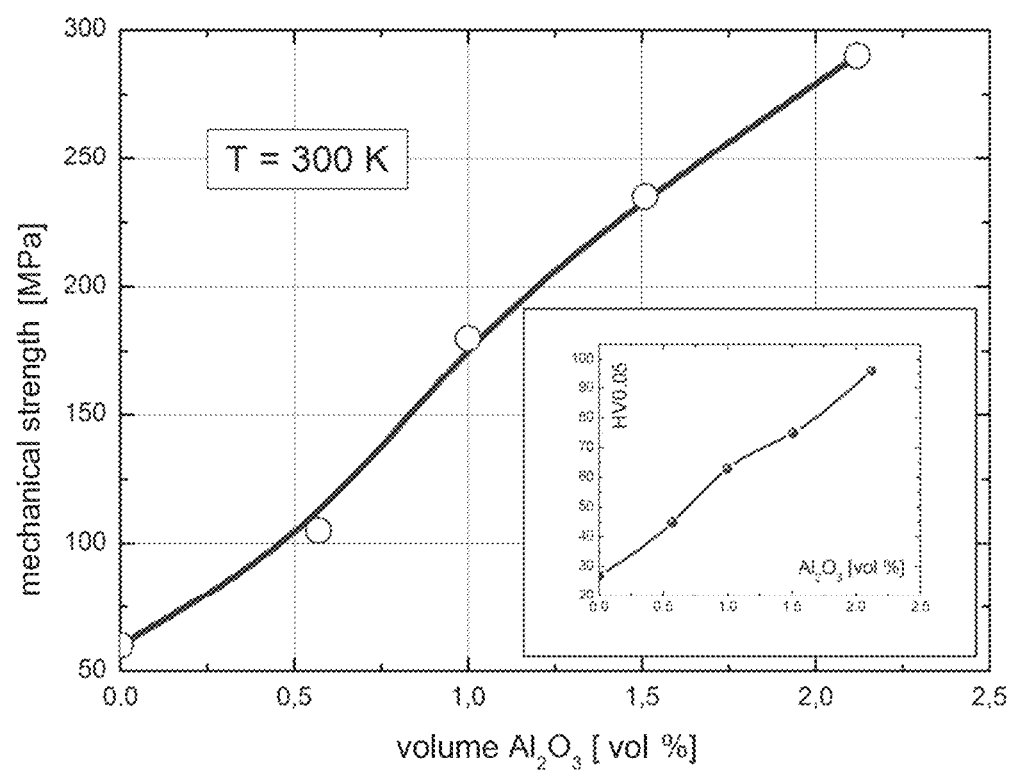
FIG. 12 shows the mechanical properties (ultimate tensile strength and Vickers hardness) of the Al+Al$_2$O$_3$ composite at a temperature of 300 K as a function of the Al$_2$O$_3$ content given by the thickness of the native am-Al$_2$O$_3$ layer on the surface of the Al powder used and the relative surface area of the used Al powder.

The Al sheath 3 efficiently stabilized by $Al_2O_3$ nanoparticles (FIGS. 4 and 5) maintains its Al grain structure formed by submicrometric grains with an average transversal grain size of about 480 nm and which are extensively elongated along to the direction of deformation throughout the wire forming process as well as after the annealing reaction performed at a temperature close to the melting temperature of the $Al+Al_2O_3$ composite (i.e., approximately 656° C. and 653° C., respectively). Thus, the $Al+Al_2O_3$ composite sheath retains to a large extent also its advantageous mechanical properties (e.g., Vickers hardness >60, ultimate tensile strength >200 MPa) (FIG. 12). In this example the content of crystalline $Al_2O_3$ nanoparticles, which have a size of about 25 or 28 nm and are evenly distributed in Al matrix, is about 1.4 vol. %. As shown in FIG. 10, the $Ta/Al+Al_2O_3$ interface is metallurgically clean without the presence of undesired porosity, cracks and intermetallic phases, which confirms the course of hardness at the interface (FIG. 11).

Figure 14:
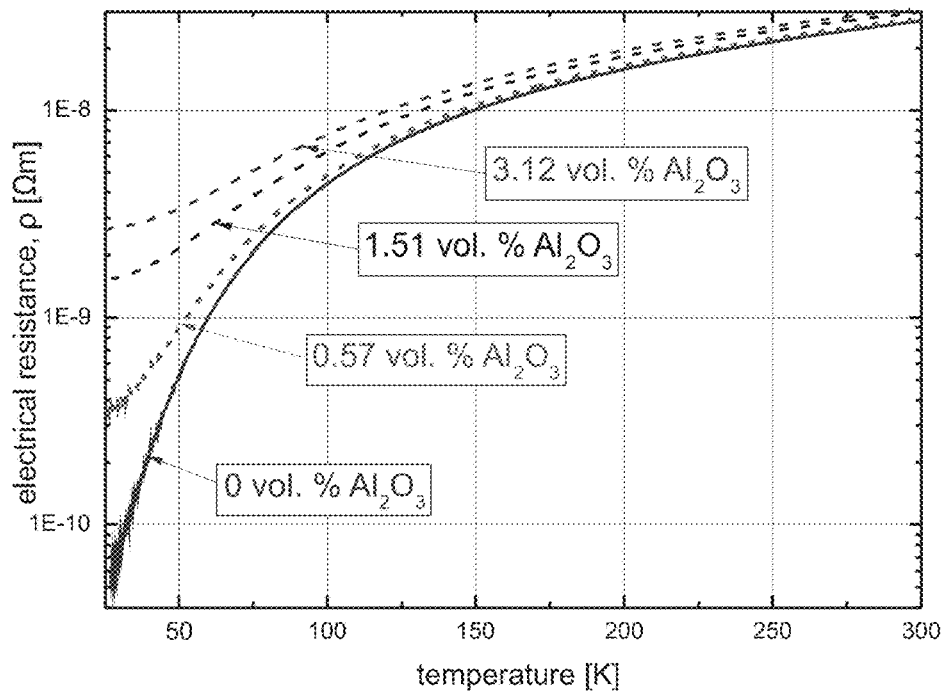
FIG. 14 illustrates the temperature dependence of the electrical resistance of the Al+Al$_2$O$_3$ composite sheath for different concentrations of the Al$_2$O$_3$ phase.

The $Al+Al_2O_3$ composite exhibits a preferred residual-resistance ratio $R_{300K}/R_{25K}=20$ and an electrical resistance of approximately $9.5 \cdot 10^{-8}$ Ohm at 25K (FIG. 14). At cryogenic temperatures, the $Al+Al_2O_3$ composite retains the advantageous mechanical strength required to stabilize the $MgB_2$ superconducting core (for example the yield strength equals to 260 MPa at 77 K). The superconductor exhibits high critical current values at 4.2 K, for example 100 and 1000 A in the magnetic fields 6 and 2.2 T, respectively.

By anodizing the surface of the $Al+Al_2O_3$ composite sheath 3, a stable $Al_2O_3$ film of a thickness of several microns was formed on the surface of the superconductor, which provide sufficient electrical insulation by increasing the breakdown voltage from about 1 to 300 V.

Figure 9:
FIG. 9 is a longitudinal microstructure of the Al+Al$_2$O$_3$ sheath in superconductor heated at high temperature of 645° C. for 30 min with coarsened Al grains and a distinct substructure of low angle Al grain boundaries decorated with forest dislocations. The microstructure of the composite is similar in the transversal direction. Images are obtained in transmission electron microscope.
Figure 16:
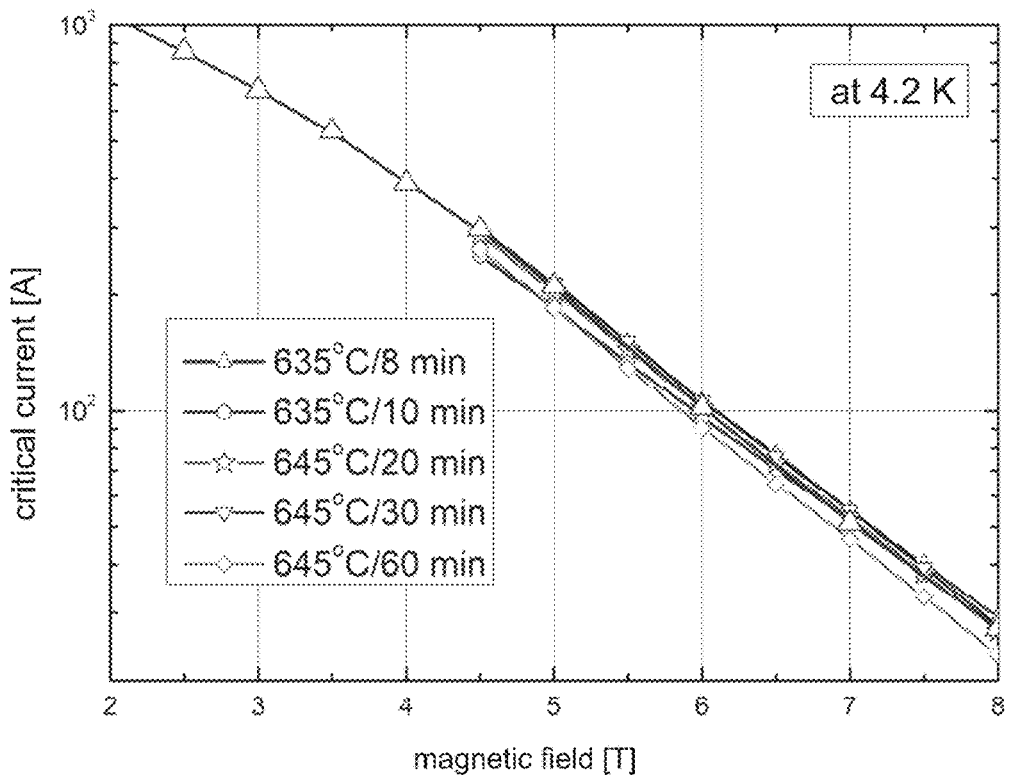
FIG. 16 shows the critical currents at 4.2 K of the Al+Al$_2$O$_3$/Ta/Mg+B wire prepared from Al of 99.8 wt. % powder of d$_{50}$=3 μm heat treated by the various annealing to form MgB$_2$ core.

If the deformed $Al+Al_2O_3/Ta/Mg+B$ wire is intentionally subjected to annealing at a temperature above 635° C., for example at 645° C. for 30 min, the temperature of the superconductor may increase above the melting point of $Al+Al_2O_3$ composite (i.e., above 656° C., resp. above 653° C.). Despite the local melting of the Al grains, the heat-treated wire remains stable and does not lose its shape integrity. The significant coarsening of Al grain is observed in such $Al+Al_2O_3$ composite sheath (FIG. 9). A typical texture of severely elongated Al grains disappears and transforms to equiaxed Al grains with several hundred pm in size. Nevertheless, a distinct substructure, formed by low angle grain boundaries and decorated by a dense dislocation network, retained in Al matrix. This microstructural change does not have a major effect on the critical current values, which are mostly affected only by the $MgB_2$ structure (FIG. 16). Obviously, the mechanical properties of such heat-treated composite decrease significantly (Vicker hardness deteriorates down to ~35).

Example 2

Figure 20:
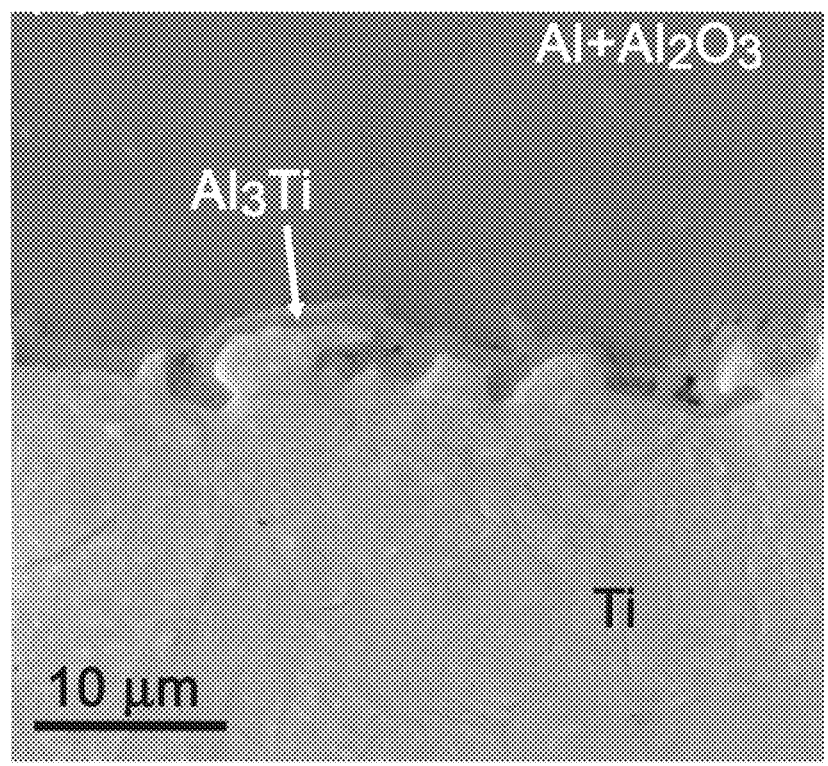
FIG. 20 shows the interface between the Al+Al$_2$O$_3$ composite and the barrier Ti layer with a thin Al$_3$Ti interface layer in the superconductor heat treated at 628° C. for 10 min. obtained in scanning electron microscope.
Figure 21:
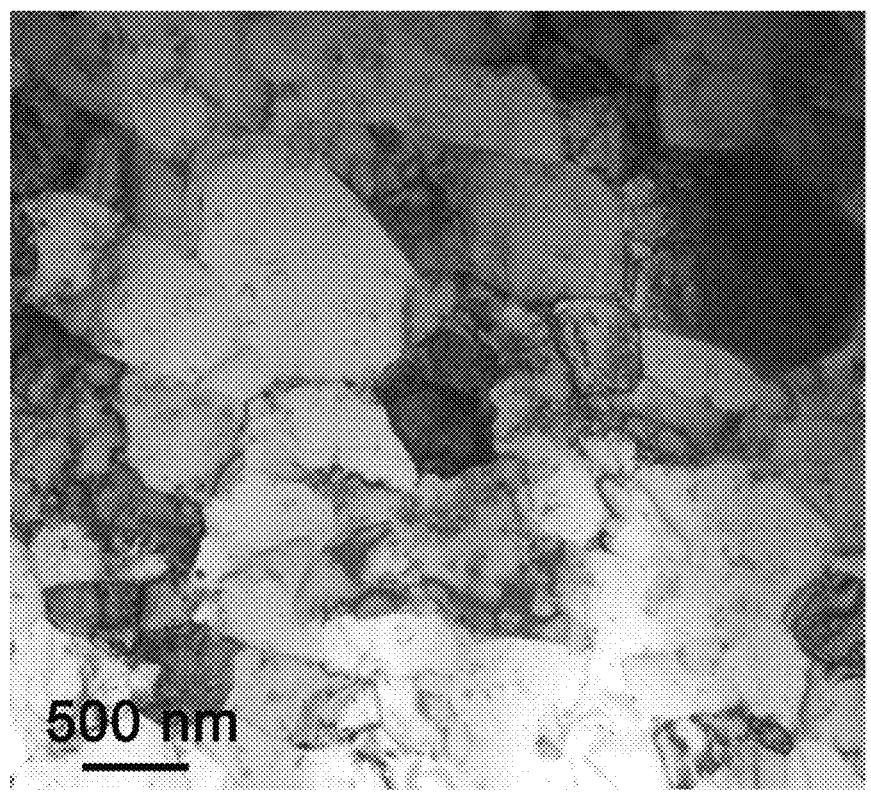
FIG. 21 shows a fine-grained transversal microstructure of the Al+Al$_2$O$_3$ sheath of a single MgB$_2$ core superconductor with the Ti barrier heat treated at 628° C. for 10 min. The images are obtained in transmission electron microscope.
Figure 22:
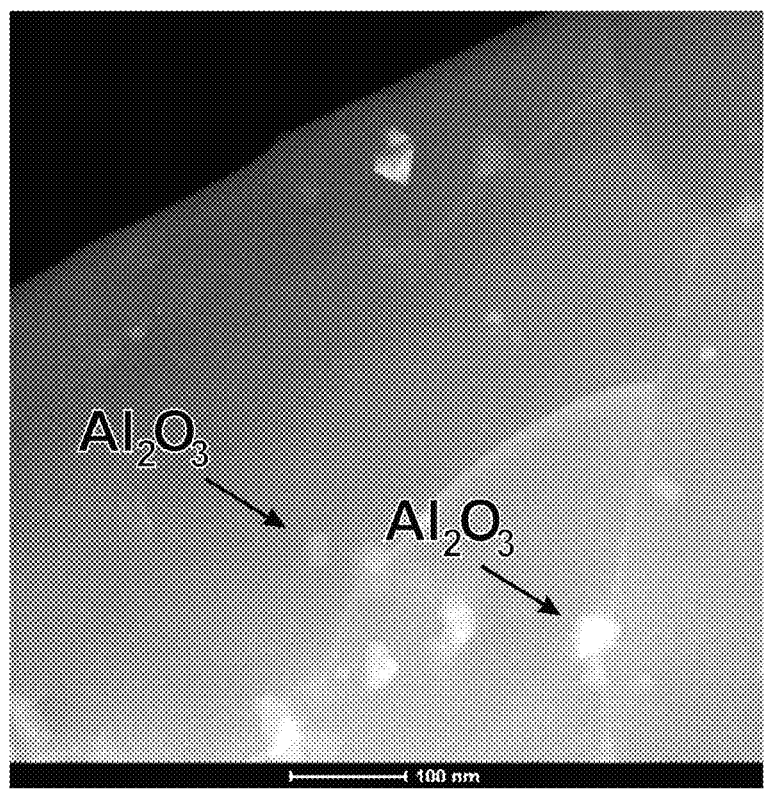
FIG. 22 shows a fine-grained transversal microstructure of the Al+Al$_2$O$_3$ sheath of a single MgB$_2$ core superconductor with the Ti barrier heat treated at 628° C. for 10 min. Black arrows illustrate crystalline Al$_2$O$_3$ nanoparticles in Al grain interiors and at high angle grain boundaries. The images are obtained in a dark field in high-resolution transmission electron microscope.

In this example, according to FIGS. 20 to 22, the single-core superconductor is fabricated from the Mg 99.99 wt. % wire with the diameter of 2.9 mm, which is surrounded by the B 99.8 wt. % powder with the size below 1 μm in the Ti 99.99 wt. % tube with an inner diameter of 5.5 mm and an outside diameter of 7.2 mm. The Mg+B/Ti semi-product is rotatory swaged to the tube with the diameter of 6.2 mm and then inserted into the $Al+Al_2O_3$ composite tube. The $Al+Al_2O_3$ composite is manufactured using the nitrogen atomized Al 99.8 wt. % powder with $d_{50}=3$ μm. The atomized powder is cold isostatically pressed into a green billet, which is subsequently degassed at 420° C. for 12 h under vacuum. The degassed powder billet is extruded at 420° C. using a reduction ratio of 8:1 into a rod with the diameter of 10 mm, from which a tube with an internal diameter of 6.3 mm and an outside diameter of 9.1 mm is machined. Such assembly unit of $Al+Al_2O_3/Ti/Mg+B$ is then cold rotatory swaged to a diameter of 7.5 mm and cold groove rolled to a wire with approximate cross-section of 1×1 mm².

The $Al+Al_2O_3$ composite sheath mechanically stabilizes the Mg+B/Ti core 1 during intense plastic deformation, ensures homogeneous deformation along the cross-section and length, compaction of Mg+B components in the core, and assures the integrity of $Al+Al_2O_3/Ti/Mg+B$ assembly unit without the formation of undesirable cracks other flows. The intensively deformed $Al+Al_2O_3/Ti/Mg+B$ wire is subsequently subjected to annealing at 628° C. for a total time of 10 min and the heating rate of 25° $C. \cdot min^{-1}$ under a protective atmosphere of Ar, during which reaction between Mg wire and B powder takes place, followed by formation of the $MgB_2$ superconducting core 1 (as shown in FIG. 3). Due to the exothermic reaction between Mg and B, overheating occurs and the temperature increases shortly up to about 642.5° C. In the resulting superconductor, $MgB_2$ core 1 forms approximately 23 vol. %, Ti barrier 2 approximately 27 vol. %, and Al composite sheath 3 approximately 50 vol. %.

The Al sheath 3 efficiently stabilized with crystalline $Al_2O_3$ nanoparticles with the size of approximately 28 nm and a total content of 1.4 vol. % (FIG. 22) retains its fine-grained structure of submicrometric Al grains with an average transversal grain size of approximately 800 nm (FIG. 21) after the heat treatment was performed. In this way, the $Al+Al_2O_3$ composite sheath also preserves to a large extent its advantageous mechanical properties (e.g., Vickers microhardness of 56 Pa). As shown in FIG. 20, on the $Ti/Al+Al_2O_3$ interface, which is free of undesired porosity and cracks, exists a thin, approximately 1 μm thick layer of the intermetallic $Al_3Ti$ phase. The formation of an undesirable $Al_3Ti$ layer, which may be detrimental in respect to thermal and electrical conductivity of the superconducting wire, is significantly reduced by the short annealing mode realized at a relatively low temperature and fast heating rate and reduced diffusivity of Ti in $Al+Al_2O_3$. The superconducting wire exhibits a reasonable current density at a temperature of 4.2 K, for example, $10^4$ and $10^5$ $A \cdot cm^{-2}$, in the fields 5.6 and 2 T, respectively, and a good tolerance of critical currents to deformation, for example, up to the tensile strain of 0.21% at 4.2 K in the 6 T magnetic field.

Example 3

Figure 1:
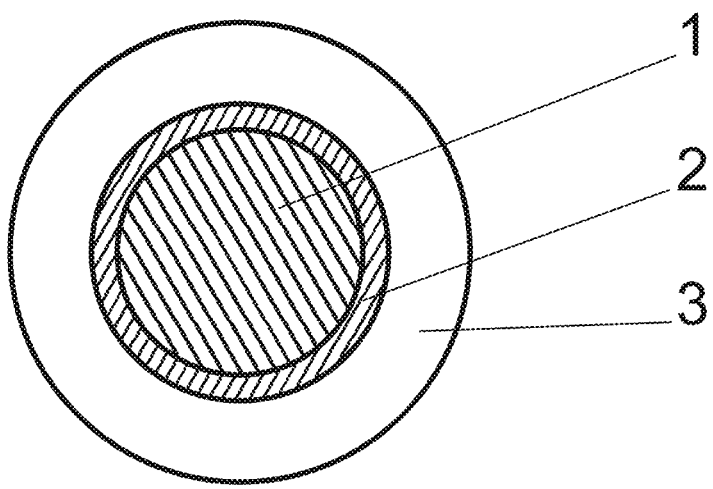
FIG. 1 is a schematic cross-section of a single core superconductor with a barrier layer.
Figure 2:
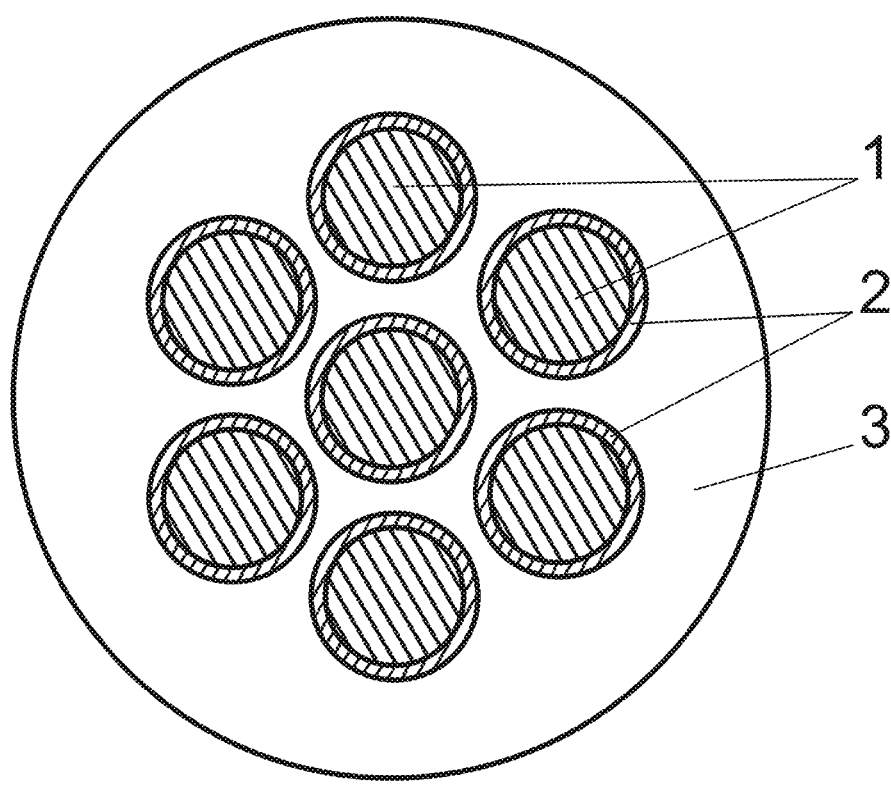
FIG. 2 is a schematic cross-section of a multifilament superconductor with a barrier layer.

In this example according to FIG. 2, the multifilament superconductor is fabricated such that seven cores 1 with barrier 2 are manufactured similarly to Example 1 and then the cores 2 are inserted into a Al composite tube with larger diameter and formed into a wire similarly to single-core wire.

Example 4

Figure 13:
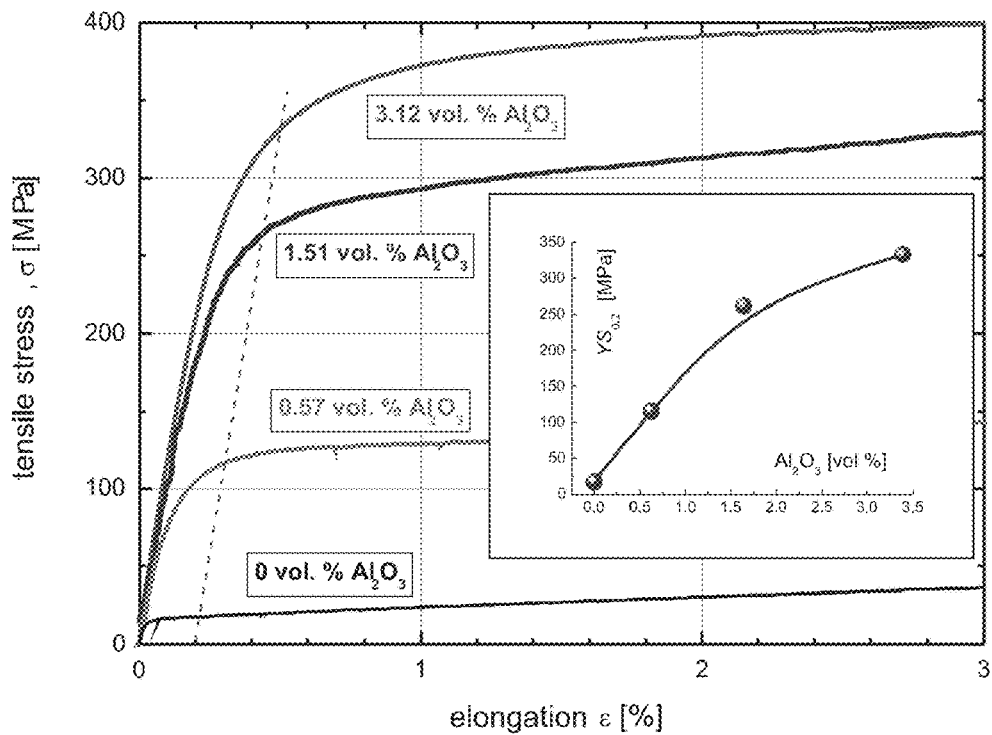
FIG. 13 illustrates the tensile stress-strain curves of the Al+Al$_2$O$_3$ composite at a temperature of 77 K as a function of the Al$_2$O$_3$ content given by the thickness of the native am-Al$_2$O$_3$ layer on the surface of the Al powder used and the relative surface area of the used Al powder. In the chart insert, the function of 0.2% offset strain stress (YS$_{0.2}$) is displayed as a function of the Al$_2$O$_3$ phase content at the temperature of 77 K.

In this example, as shown in FIGS. 11 to 13, the composites with various portions of $Al_2O_3$ were tested: 0.0 vol. % (i.e., wrought Al, not powdered composites), 0.57 vol. %, 1.51 vol. %, 2.12 vol %, and 3.12 vol. %. The changes in $Al_2O_3$ content were obtained by using gas atomized Al 99.8 wt. % powders of different mean particle size $d_{50}$=0.8 to 21 µm. The resulting mechanical properties of the sheath 3 are shown in FIG. 12 and the tensile stress-strain curves varying content of $Al_2O_3$ are shown in FIG. 13. The mechanical strength increases proportionally with the $Al_2O_3$ content, which is a function of the average transversal Al grain size in the composite i.e., higher yield strength and hardness are achieved with a smaller grain size. As shown in FIG. 14, the electrical resistance of the composite at low operating temperatures increases with $Al_2O_3$ content that is inversely proportional to the Al grain size in the composite. However, even for Al powder with $d_{50}$=0.8 µm and with $Al_2O_3$ content of 3.12 vol. % it still achieves an acceptable value of $2.6 \cdot 10^{-9}$ Ωm.

Example 5

Figure 17:
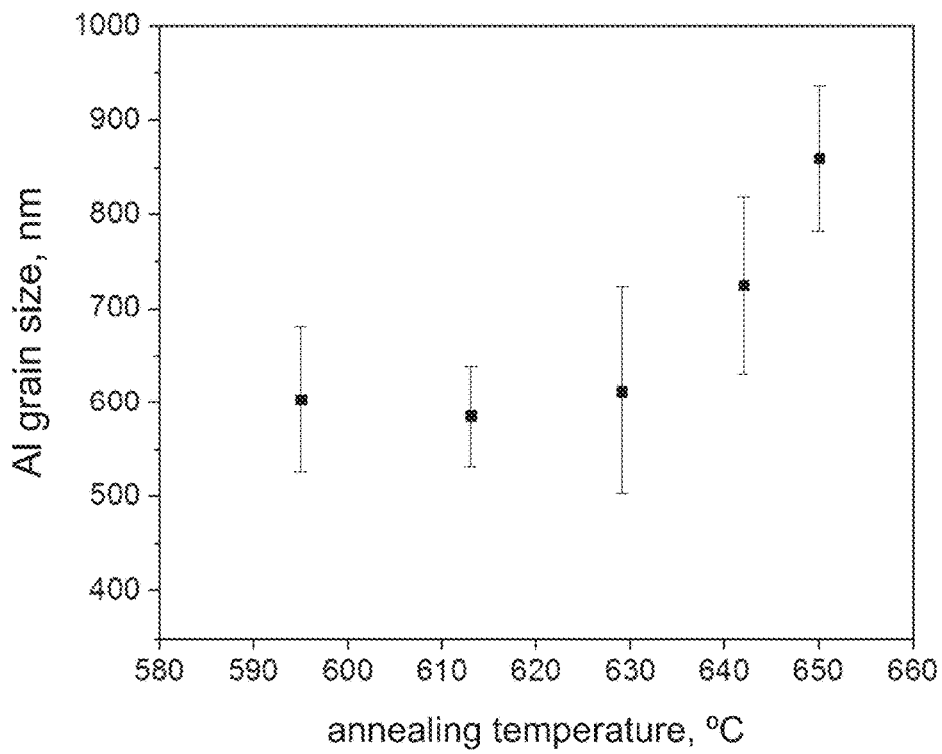
FIG. 17 shows a change in the Al grain size at cryogenic temperatures for Al+1.6 vol % Al$_2$O$_3$ composite wire prepared from Al 99.996% powder of size d$_{50}$=1.9 μm after 30 min annealing realized at the temperatures 595-650° C.
Figure 18:
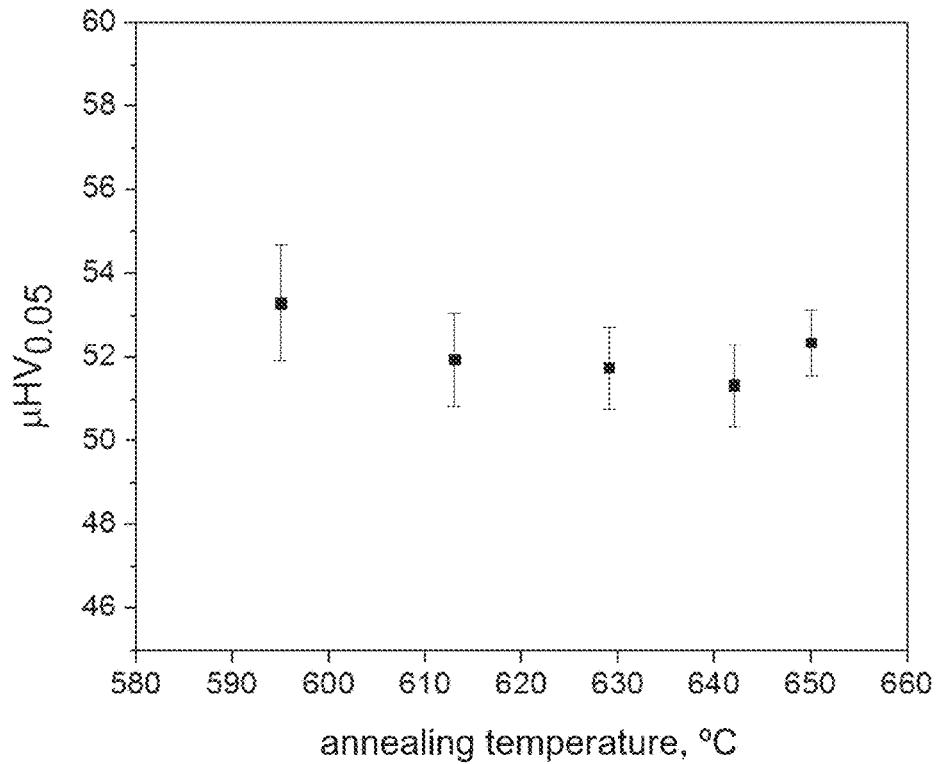
FIG. 18 shows a microhardness at cryogenic temperatures for Al+1.6 vol % Al$_2$O$_3$ composite wire prepared from Al 99.996% powder of size d$_{50}$=1.9 μm after 30 min annealing realized at the temperatures 595-650° C.
Figure 19:
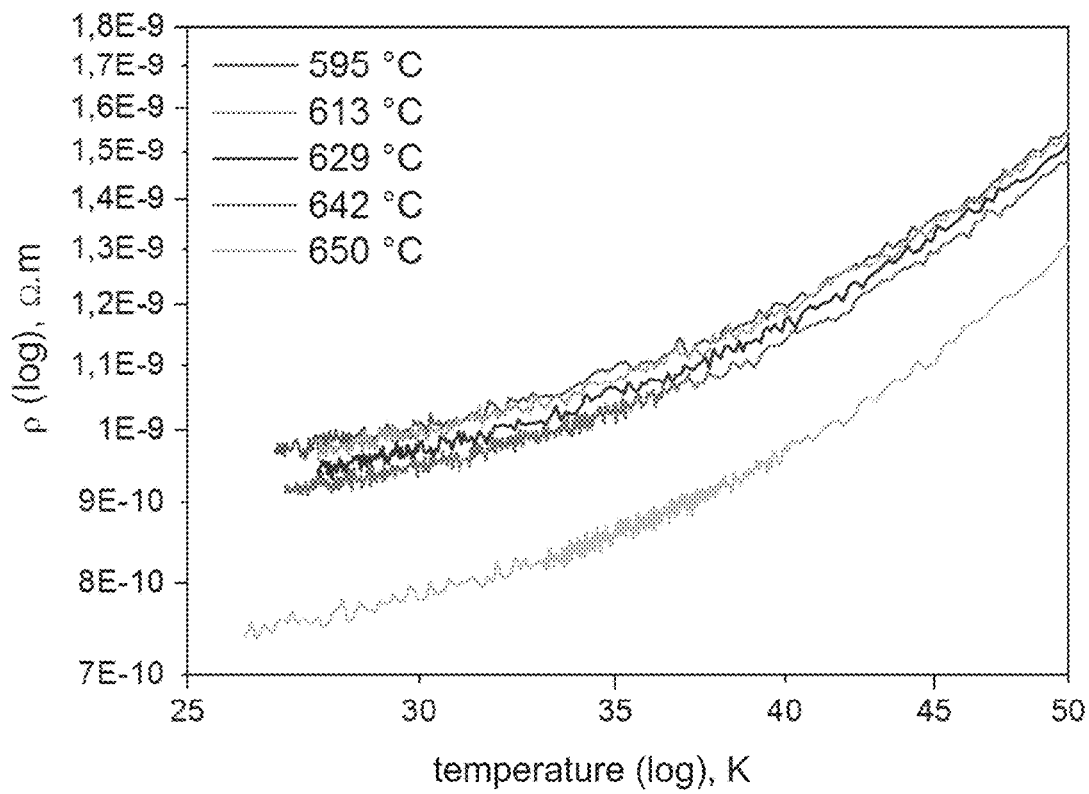
FIG. 19 shows an electrical resistance at cryogenic temperatures for Al+1.6 vol % Al$_2$O$_3$ composite wire prepared from Al 99.996% powder of size d$_{50}$=1.9 μm after 30 min annealing realized at the temperatures 595-650° C.

In this example, as shown in FIGS. 17-19, the structural stability of Al+1.6 vol. % composite wire prepared from Al 99.996 wt. % powder with $d_{50}$ of 1.9 µm was verified after annealing held for 30 minutes at 595-650° C. As shown in FIG. 17, the transversal Al grain size changes only slowly from 604 nm to 860 nm as the annealing temperature increases from 595° C. to 650° C., respectively. This finding is confirmed by only subtle changes to the micro-hardness (FIG. 18) and the electrical resistance at cryogenic temperatures (FIG. 19) determined for annealed Al+$Al_2O_3$ composites.

INDUSTRIAL APPLICABILITY

Industrial applicability is obvious. According to the invention, it is possible to reproducibly fabricate ultra-lightweight superconductors based on Al.

LIST OF REFERENCE LABELS

1—the core of a superconductor wire
2—the diffusion barrier in a superconductor wire
3—the sheath of a superconductor wire
PIT—powder-in-tube
IMD—internal magnesium diffusion to boron
PM—powder metallurgy

The invention claimed is:

1. A superconductor wire comprising:
a superconductive core (1) based on magnesium diboride ($MgB_2$);
an outer sheath (3) based on aluminium (Al);
wherein the superconductor wire has a density of less than 2.9 g.cm$^{-3}$;
wherein the superconductor includes at least one core (1) and a sheath (3) fully covers outer surface of the wire,
wherein the outer sheath (3) is a composite material, which includes a metallic matrix of a pure Al and stabilizing component of aluminium oxide ($Al_2O_3$) in a volume of Al+$Al_2O_3$ composite sheath (3):
the $Al_2O_3$ component occupies from 0.25 to 5 vol. %,
the Al matrix occupies from 95 to 99.75 vol. %,
and impurities occupy up to 1 vol. %, preferably up to 0.3 vol. %,
wherein the $Al_2O_3$ component is homogenously dispersed in an entire volume of Al+$Al_2O_3$ composite.

2. The superconductor wire based on $MgB_2$ core with Al based sheath according to claim 1, wherein the $Al_2O_3$ component occupies from 0.5 to 3 vol. % in a volume of Al+$Al_2O_3$ composite.

3. The superconductor wire based on $MgB_2$ core with Al based sheath according to claim 1, wherein the wire has an overall density less than 2.7 g.cm$^{-3}$.

4. The superconductor wire based on $MgB_2$ core with Al based sheath according to claim 1, wherein the sheath (3) is made of Al+$Al_2O_3$ composite tube, which is a direct product of powder metallurgy or is produced by machining of the powder metallurgy product, wherein the powder metallurgy product is fabricated by consolidating of atomized Al powders.

5. The superconductor wire based on $MgB_2$ core with Al based sheath according to claim 4, wherein the Al powder has a mean particle size from 0.5 to 20 µm.

6. The superconductor wire based on $MgB_2$ core with Al based sheath according to claim 1, wherein the $Al_2O_3$ component stems from a thin native surface layer, which passivates the Al powder used for consolidation.

7. The superconductor wire based on $MgB_2$ core with Al based sheath according to claim 1, wherein the sheath (3) is made of Al+$Al_2O_3$ composite tube, which is a direct product of powder metallurgy or is produced by machining of the powder metallurgy product, wherein the powder metallurgy product is fabricated by consolidating of mechanically milled mixture of Al and $Al_2O_3$ powders.

8. The superconductor wire based on $MgB_2$ core with Al based sheath according to claim 1, wherein the $Al_2O_3$ component in Al+$Al_2O_3$ composite sheath (3) has at least one characteristic dimension less than 250 nm, preferably less than 50 nm.

9. The superconductor wire based on $MgB_2$ core with Al based sheath according to claim 1, wherein the Al grains in a final Al+$Al_2O_3$ composite sheath (3) has transversal grain size less than 10 µm, preferably less than 1 µm and even more preferably less than 900 nm.

10. The superconductor wire based on $MgB_2$ core with Al based sheath according to claim 1, wherein the $Al_2O_3$ component are nanometric crystalline $Al_2O_3$ dispersoids, located at the Al grain boundaries and/or in the Al grain interiors.

11. The superconductor wire based on $MgB_2$ core with Al based sheath according to claim 1, further comprising a diffusion barrier (2), which has a form of a layer at the interface between the core (1) and the sheath (3).

12. The superconductor wire based on $MgB_2$ core with Al based sheath according to claim 11, wherein the diffusion barrier (2) is based on the elements from a group of titanium (Ti), tantalum (Ta), niobium (Nb), vanadium (V), iron (Fe), or is based on a combination of these elements, preferably based on Ti and/or V.

13. The superconductor wire based on $MgB_2$ core with Al based sheath according to claim 1, wherein on the surface of an outer sheath (3) is a thin insulating $Al_2O_3$ layer, preferably formed by anodic oxidation.

14. The superconductor wire based on $MgB_2$ core with Al based sheath according to claim 13, wherein the insulating $Al_2O_3$ layer formed by anodic oxidation has the thickness up to 10 µm.

* * * * *